(12) United States Patent
Lin et al.

(10) Patent No.: US 9,229,034 B2
(45) Date of Patent: Jan. 5, 2016

(54) SAMPLING CIRCUIT FOR A CURRENT TRANSFORMER

(71) Applicant: Delta Electronics, Inc., Taoyuan Hsien (TW)

(72) Inventors: Hua-Sheng Lin, Taoyuan Hsien (TW); Yung-Sheng Yeh, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 112 days.

(21) Appl. No.: 14/109,217

(22) Filed: Dec. 17, 2013

(65) Prior Publication Data

US 2015/0054549 A1      Feb. 26, 2015

(30) Foreign Application Priority Data

Aug. 23, 2013    (TW) .............................. 102130163 A

(51) Int. Cl.
     *G01R 19/22*      (2006.01)
     *G01R 19/00*      (2006.01)
     *H02M 1/00*      (2007.01)

(52) U.S. Cl.
     CPC ... *G01R 19/0092* (2013.01); *H02M 2001/0009* (2013.01)

(58) Field of Classification Search
     CPC ....................................................... G01R 19/22
     USPC ............................................. 327/91, 92, 104
     See application file for complete search history.

(56) References Cited

U.S. PATENT DOCUMENTS

| | | | | |
|---|---|---|---|---|
| 3,582,758 A | * | 6/1971 | Gunn | 363/127 |
| 4,150,412 A | * | 4/1979 | Hammarlund | 361/76 |
| 4,698,740 A | * | 10/1987 | Rodgers et al. | 363/89 |
| 4,922,396 A | * | 5/1990 | Niggemeyer | 363/21.01 |
| 4,951,186 A | * | 8/1990 | Brakus et al. | 363/21.05 |
| 5,790,389 A | * | 8/1998 | Hua | 363/20 |
| 2011/0304307 A1 | | 12/2011 | Shieh et al. | |
| 2014/0153289 A1 | * | 6/2014 | Kao et al. | 363/17 |

FOREIGN PATENT DOCUMENTS

| | | |
|---|---|---|
| CN | 202737766 U | 2/2013 |
| TW | 201145776 A | 12/2011 |

* cited by examiner

*Primary Examiner* — William Hernandez
(74) *Attorney, Agent, or Firm* — Muncy, Geissler, Olds & Lowe, P.C.

(57) ABSTRACT

A sampling circuit for current transformer includes a current sensing unit, a rectification unit, a sampling unit and a switching unit. The rectification unit is electrically connected to the current sensing unit. The sampling unit is electrically connected to the rectification unit and outputs a first signal. The sampling unit includes an energy leakage device and a switching device. The switching device is electrically connected to the energy leakage device in parallel, and is turned on or off according to a second signal and a third signal. The switching unit is electrically connected to the sampling unit, and is turned on or off according to the second signal.

6 Claims, 2 Drawing Sheets

SAMPLING CIRCUIT FOR A CURRENT TRANSFORMER

CROSS REFERENCE TO RELATED APPLICATIONS

This Non-provisional application claims priority under 35 U.S.C. §119(a) on Patent Application No(s). 102130163 filed in Taiwan, Republic of China on Aug. 23, 2013, the entire contents of which are hereby incorporated by reference.

BACKGROUND OF THE INVENTION

1. Field of Invention

The invention relates to a sampling circuit for a current transformer.

2. Related Art

With the development of technologies, the current transformer (CT) has been commonly used in various electronic products, such as a power supply, a detector, or a transformer. The current transformer can be roughly divided into an AC-to-DC kind and a DC-to-DC kind according to the transformation method.

In the current technology, the AC-to-DC or DC-to-DC current transformer obtains the current signal by a phase-locked and frequency-locked method. However, when the inputted AC or DC power has an abrupt fluctuation, the current transformer can not operate until the correct phase and frequency is judged. During the idling period, the power still needs to be provided, so the filter capacity needs to be increased. Therefore, the space and cost of the product are both increased.

Besides, the DC-to-DC current transformer normally operates in the first quadrant, and therefore an additional period is necessary for leaking the energy of the current transformer in order to avoid the saturation: Accordingly, the 100% duty cycle can not be reached.

Therefore, it is an important subject to provide a sampling circuit of a current transformer so that the filter capacity needn't be increased when the inputted AC or DC power has an abrupt fluctuation, and thus the space and cost of the product will not be increased, and the 100% duty cycle can be reached.

SUMMARY OF THE INVENTION

In view of the foregoing subject, an objective of the invention is to provide a current transformer so that the filter capacity needn't be increased when the inputted AC or DC power has an abrupt fluctuation, and thus the space and cost of the product will not be increased, and the 100% duty cycle can be reached.

To achieve the above objective, a sampling circuit for a current transformer according to the invention includes a current sensing unit, a rectification unit, a sampling unit and a switching unit. The rectification unit is electrically connected to the current sensing unit. The sampling unit is electrically connected to the rectification unit and outputs a first signal. The sampling unit includes an energy leakage device and a switching device. The switching device is electrically connected to the energy leakage device in parallel, and is turned on or off according to a second signal and a third signal. The switching unit is electrically connected to the sampling unit, and is turned on or off according to the second signal.

In one embodiment, the switching device is a transistor switch.

In one embodiment, the energy leakage device is a Zener diode.

In one embodiment, the sampling unit further includes a resistance device which is connected to the energy leakage device and the switching device in parallel.

In one embodiment, the switching unit includes a transistor switch and a resistance device electrically connected to the transistor switch.

In one embodiment, the second signal is a PWM (pulse-width modulation signal.

To achieve the above objective, a sampling circuit for a current transformer according to the invention comprises a current sensing unit, a rectification unit, a high-pass filter unit and a sampling unit. The rectification unit is electrically connected to the current sensing unit. The high-pass filter unit is electrically connected to the current sensing unit and the rectification unit. The sampling unit is electrically connected to the rectification unit and outputs an outputted signal.

In one embodiment, the rectification unit is a bridge rectifier.

In one embodiment, the high-pass filter unit includes a capacitance device.

In one embodiment, the sampling unit includes a resistance device.

In one embodiment, the sampling unit further includes a capacitance device electrically connected to the resistance device.

As mentioned above, according to the sampling circuit applied to a current transformer of the invention, the filter capacity needn't be increased when the inputted AC or DC power has an abrupt fluctuation. Thus, the space and cost of the product will not be increased. Besides, the 100% duty cycle can be reached in the invention. Therefore, the invention has several advantages such as energy conservation, environmental protection and low production cost.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
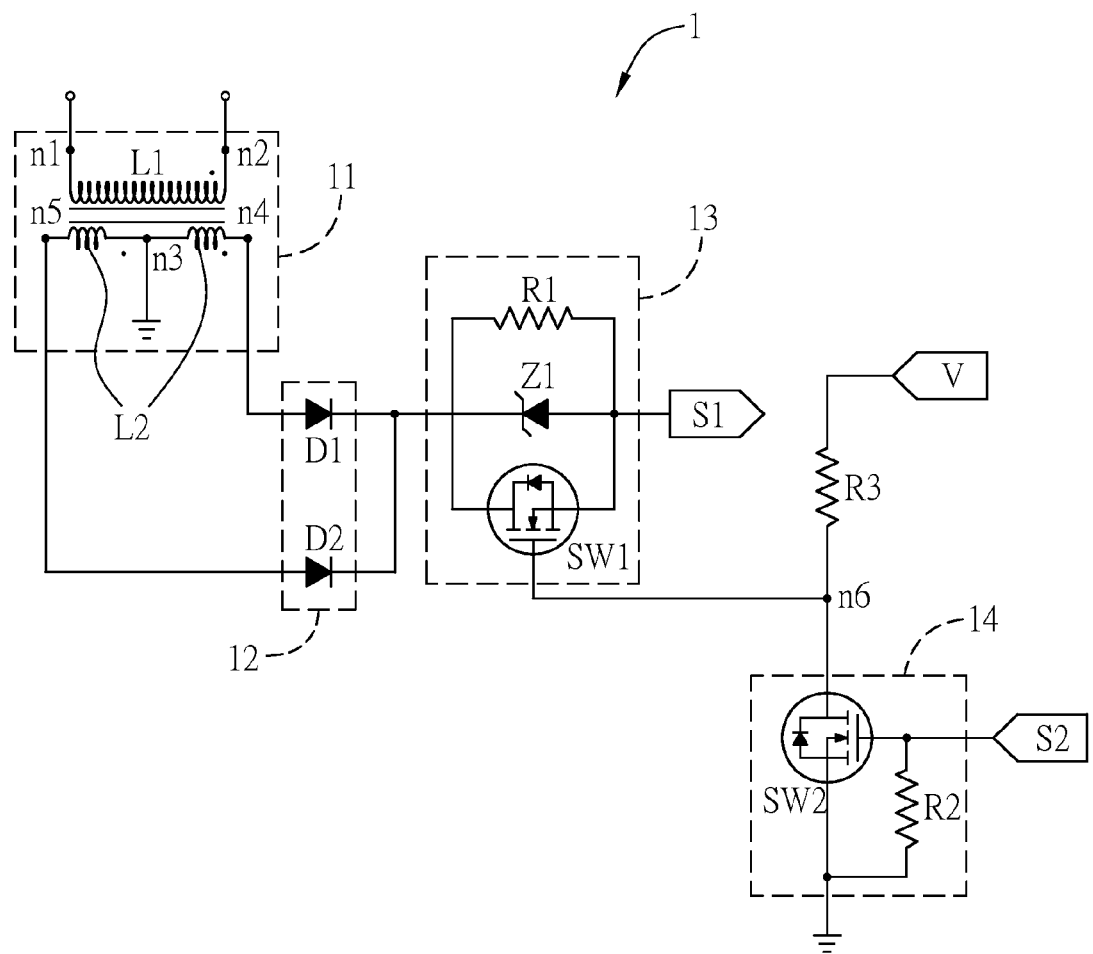
FIG. 1 is a circuit diagram of a sampling circuit applied to a current transformer according to a preferred embodiment of the invention.

FIG. 1 is a circuit diagram of a sampling circuit applied to a current transformer according to a preferred embodiment of the invention. The sampling circuit 1 includes a current sensing unit 11, a rectification unit 12, a sampling unit 13 and a switching unit 14. The sampling circuit 1 can be applied to an AC-to-DC or DC-to-DC current transformer for example.

The current sensing unit 11 includes a first coil L1 and a second coil L2 for example, and the first and second coils L1 and L2 are coupled with each other electromagnetically. When the current flows from the node n1 of the first coil L1 to the node n2, an induced current generated by the induction of the second coil L2 flows from the node n3 to the node n4.

Likewise, when the current flows from the node n2 of the first coil L1 to the node n1, the induced current generated by the induction of the second coil L2 will flow from the node n3 to the node n5. To be noted, the number of turns of the first coil L1 or the second coil L2 can be designed according to the practical requirements, and the invention is not limited thereto.

The rectification unit 12 is electrically connected to the current sensing unit 11. As an embodiment, the rectification unit 12 includes a first diode D1 and a second diode D2. The anode end of the first diode D1 is electrically connected to the node n4 of the second coil L2 while the anode end of the second diode D2 is electrically connected to the node n5 of the second coil L2. When the current flows from the node n3 of the second coil L2 to the node n4, the first diode D1 will be turned on (enabled) and the second diode D2 will be turned (cut) off, In this case, the current can flow through the first diode D1, from the anode end of the first diode D1 to the cathode end thereof. On the other hand, when the current flows from the node n3 of the second coil L2 to the node n5, the first diode D1 will be cut off and the second diode D2 will be enabled. In this case, the current can flow through the second diode D2, from the anode end of the second diode D2 to the cathode end thereof. Each of the first and second diodes Di and D2 can he replaced by a high-side MOSFET for achieving the same function.

The sampling unit 13 is electrically connected to the rectification unit 12 and outputs a first signal S1. The sampling unit 13 includes an energy leakage device Z1 and a switching device SW1. The switching device SW1 is electrically connected to the energy leakage device Z1, and is enabled or cut off according to a first second signal S2 and a third signal V. In detail, the energy leakage device Z1 can be a Zener diode for example, and the cathode end thereof is electrically connected to the cathode ends of the first diode D1 and second diode D2 while the anode end thereof outputs the first signal S1. The switching device SW1 can be a transistor switch for example, with a first end electrically connected to the cathode ends of the first and second diodes D1 and D2, a second end coupled with the second signal S2 and the third signal V, and a third end outputting the first signal S1. When the switching device SW1 is enabled, the current can flow from the first end thereof to the third end thereof, without through the energy leakage device Z1. On the other hand, when the switching device SW1 is cut off, the energy leakage device Z1 will break down so that the current can flow through the energy leakage device Z1. Besides, because the characteristic curve of the switching device SW1 in the breakdown situation is linear, the energy can be consumed by the energy leakage device Z1. In this embodiment, the sampling unit 13 can further include a resistance device R which is connected with the energy leakage device Z1 and switching device SW1 in parallel, to avoid them from being damaged.

The switching unit 14 is electrically connected to the sampling unit 13, and is enabled or cut off according to the second signal S2. As an embodiment, the switching unit 14 can include a transistor switch SW2. The first end of the transistor switch SW2 is coupled to the second end of the switching device SW1, the second end of the transistor switch SW2 is coupled to the second signal S2, and the third end of the transistor switch SW2 is grounded. When the transistor switch SW2 is turned on (enabled), the voltage of the node n6 will be limited to 0V due to the grounded situation. On the other hand, when the transistor switch SW2 is cut off, the voltage of the node n6 will depend on the third signal V. The switching unit 14 can further include a resistance device R2 electrically connected to the transistor switch SW2, to avoid the damage of the transistor switch SW2.

The first signal S1 is an outputted signal of the sampling circuit 1. The second signal S2 is, for example, a PWM (pulse-width modulation) signal to control whether the control device SW1 and the transistor switch SW2 are enabled or not. The third signal V can be a voltage signal for example and is coupled to the second end of the switching device SW1 and the first end of the transistor switch SW2, resulting in the dependency between the voltage of the node n6 and the third signal V, by which the switching device SW1 is controlled as enabled or cut off.

The operating principle of the sampling circuit 1 is illustrated as below from the view of the whole body thereof. When the current on the first coil L1 flows from the node n1 to the node n2, the current generated by the induction of the second coil L2 flows from the node n5, through the node n3, and to the node n4, so that the first diode D1 is enabled and the second diode D2 is cut off. In this situation, the second signal S2 and the third signal V both control the switching device SW1 to be enabled while the first signal S1 outputted by the sampling unit 13 is the current signal of the current sensing unit 11. When the current on the first coil L1 flows reversely, i.e. from the node n2 to the node n1, the current generated by the induction of the second coil L2 flows from the node n4, through the node n3, and to the node n5, so that the first diode D1 is cut off and the second diode D2 is enabled. In this situation, the second signal S2 and the third signal V both control the switching device SW1 to be cut off, and thus the energy leakage device Z1 breaks down to consume the energy for achieving the reset effect.

Figure 2:
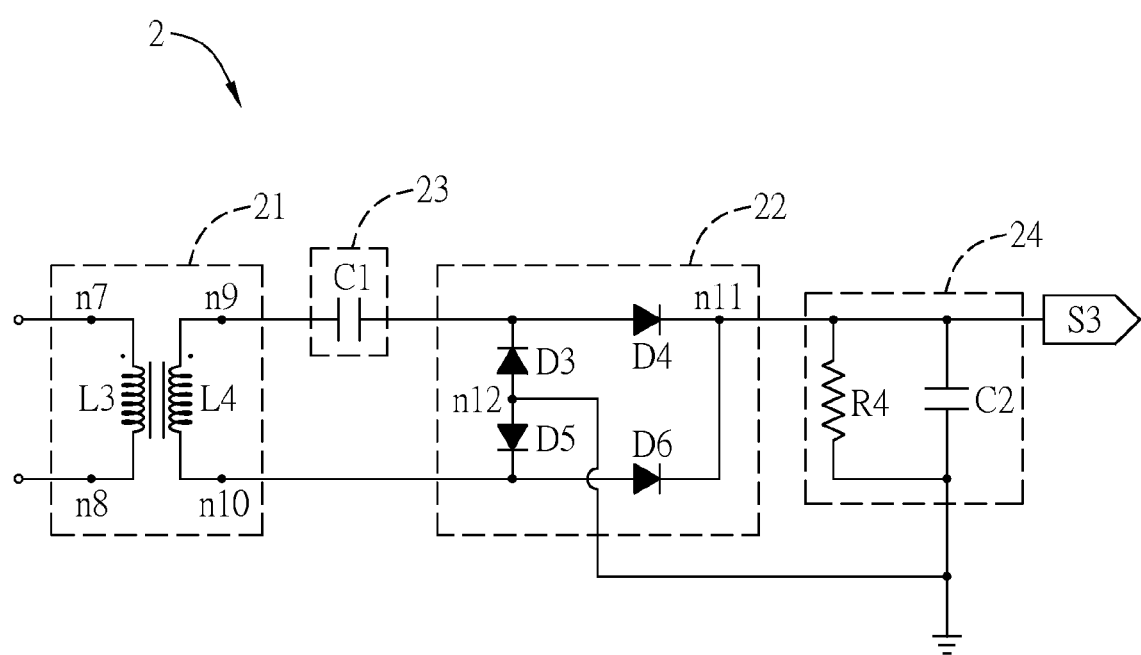
FIG. 2 is a schematic diagram of a sampling circuit applied to a current transformer according to another preferred embodiment of the invention.

FIG. 2 is a schematic diagram of a sampling circuit applied to a current transformer according to another preferred embodiment of the invention. As shown in FIG. 2, the sampling circuit 2 includes a current sensing unit 21, a rectification unit 22, a high-pass filter unit 23 and a sampling unit 24. The sampling circuit 2 can be applied to the DC-to-DC current transformer for example.

The current sensing unit 21 includes a first coil L3 and a second coil L4 for example, and the first and second coils L3 and L4 are coupled with each other electromagnetically. When the current flows from the node n7 of the first coil L3 to the node n8, an induced current generated by the induction of the second coil L4 flows from the node n9 to the node n10. Likewise, when the current flows from the node n8 of the first coil L3 to the node n7, the induced current generated by the induction of the second coil L4 will flow from the node n10 to the node n9. To be noted, the number of turns of the first coil L3 or the second coil L4 can be designed and changed according to the practical requirements.

The rectification unit 22 is electrically connected to the current sensing unit 21. The rectification unit 22 can be a bridge rectifier for example, including a plurality of diodes D3, D4, D5 and D6 for doing a full-wave rectification to the outputted current of the current sensing unit 21.

The high-pass filter unit 23 is electrically connected to the current sensing unit 21 and the rectification unit 22. The high-pass filter unit 23 can include, for example, a capacitance device C1 to filter out the low-frequency portion of the outputted current of the current sensing unit 21 for avoiding the magnetic bias. The capacitance value of the capacitance device C1 can be designed and changed according to the practical requirements.

The sampling unit 24 is electrically connected to the rectification unit 22 and outputs an outputted signal S3. As an embodiment, the sampling unit 24 can include a resistance device R4 for example to convert the current signal outputted by the rectification unit 22 into the voltage signal. Besides, the sampling unit 24 can further include a capacitance device C2 for reducing the ripple value of the outputted signal.

The operating principle of the sampling circuit 2 is illustrated as below from the view of the whole body thereof. When the current on the first coil L3 flows from the node n7 to the node n8, the current generated by the induction of the second coil L4 flows from he node n9, sequentially through the node n10, diode D6, node n11, sampling unit 24, node n12 and diode D3, and then back to the node n9. When the current flows through the sampling unit 24, the sampling unit 24 outputs the outputted signal S3, i.e. the current signal outputted by the current sensing unit 21. On the other hand, when the current on the first coil L3 flows from the node n8 to the node n7, the current generated by the induction of the second coil L4 flows from the node n10, sequentially through the node n9, diode D4, node n11, sampling unit 24, node n12 and diode D5, and then back to the node n10. When the current flows through the sampling unit 24, the sampling unit 24 outputs the outputted signal S3, i.e. the current signal outputted by the current sensing unit 21.

In summary, according to the sampling circuit applied to a current transformer of the invention, the filter capacity needn't be increased when the inputted AC or DC power has an abrupt fluctuation. Thus, the space and cost of the product will not be increased. Besides, the 100% duty cycle can be reached in the invention. Therefore, the invention has several advantages such as energy conservation, environmental protection and low production cost.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A sampling circuit for a current transformer comprising:
   a current sensing unit;
   a rectification unit electrically connected to the current sensing unit;
   a sampling unit electrically connected to the rectification unit and outputting a first signal, and comprising an energy leakage device and a switching device, wherein the switching device is electrically connected to the energy leakage device in parallel and is turned on or off according to a second signal and a third signal; and
   a switching unit electrically connected to the sampling unit and turned on or off according to the second signal.

2. The sampling circuit according to claim 1, wherein the switching device is a transistor switch.

3. The sampling circuit according to claim 1, wherein the energy leakage device is a Zener diode.

4. The sampling circuit according to claim 1, wherein the sampling unit further includes a resistance device which is connected to the energy leakage device and the switching device in parallel.

5. The sampling circuit according to claim 1, wherein the switching unit includes a transistor switch and a resistance device electrically connected to the transistor switch.

6. The sampling circuit according to claim 1, wherein the second signal a PWM (pulse-width modulation) signal.

* * * * *